(12) United States Patent
Bobry

(10) Patent No.: US 6,268,665 B1
(45) Date of Patent: Jul. 31, 2001

(54) TESTING BATTERY POWER SOURCE OF UNINTERRUPTIBLE POWER SUPPLY

(75) Inventor: Howard H. Bobry, Edmonds, WA (US)

(73) Assignee: Mutipower, Inc., Elyria, OH (US)

( * ) Notice: Subject to any disclaimer, the term of this patent is extended or adjusted under 35 U.S.C. 154(b) by 0 days.

(21) Appl. No.: 09/307,608

(22) Filed: May 10, 1999

(51) Int. Cl.[7] ........................................ H02J 9/00
(52) U.S. Cl. ................................. 307/66; 324/771
(58) Field of Search ..................... 307/64–68, 75, 307/85–87; 324/771, 119; 340/636, 693.1, 693.2, 693.3, 693.4

(56) References Cited

U.S. PATENT DOCUMENTS

| | | |
|---|---|---|
| 4,894,601 | 1/1990 | Watkins . |
| 5,646,509 | * 7/1997 | Berglund et al. ................ 320/48 |
| 5,994,793 | * 11/1999 | Bobry ................................ 307/64 |

FOREIGN PATENT DOCUMENTS

| | | |
|---|---|---|
| 2 666 658 | 3/1992 | (FR) . |
| 4 151 580 | 5/1992 | (JP) . |

OTHER PUBLICATIONS

Search Report mailed on Nov. 21, 2000 from the Patent Office of the United Kingdom for a counterpart patent application filed in that country listing the above identified references.

* cited by examiner

*Primary Examiner*—Fritz Fleming
(74) *Attorney, Agent, or Firm*—Renner, Otto, Boisselle & Sklar, LLP

(57) ABSTRACT

A method of testing the battery of an uninterruptible power system by changing the priority of the battery to make it a primary, rather than secondary, power source. This allows the battery to be tested in a fail-safe mode such that a battery failure during the test will not cause any interruption of power to the inverter and thus the load.

15 Claims, 7 Drawing Sheets

TESTING BATTERY POWER SOURCE OF UNINTERRUPTIBLE POWER SUPPLY

The present invention relates to a method and apparatus for testing the operating condition of a battery power source in an uninterruptible power supply system (UPS) for supplying power to a load, particularly to a load which is a critical element of a broadband communication system, the UPS having at least one other power source for supplying power to the load in preference to the battery power source.

BACKGROUND OF THE INVENTION

Uninterruptible power supply systems which provide truly uninterrupted power to the load on the failure of the main or working supply are often used to supply load power to critical loads, 1. e., a load for which it is crucial to have a continuous supply of power without interruption or disturbance in power. This type of UPS is widely used in broadband communication systems, e.g. telecommunication and CATV systems involving the transmission of data. This type of UPS is often referred to as a "true" UPS system to distinguish the system from standby systems in which an alternate power source must be connected into, i.e. switched into, the system upon failure of another power supply. The need to switch an alternate power supply into the system causes a disturbance or interruption of the power flow to the load over the interval it takes to detect the failure and switch the alternate power source into the system.

A true UPS system may be based on several different topologies. In a conventional dual conversion topology, well known in the art, an inverter converts d.c. power to a.c. power and supplies it to the load on a continuous basis. This type of system most frequently has a first power supply, generally an a.c. utility power line, which is rectified to provide a d.c. power source which in turn provides the d.c. power required by the inverter The rectifier for the a.c. power supply will also maintain the charge on batteries of a battery power source for supplying back-up d.c. power for the inverter. Upon failure of the a.c. power supply, the inverter continues to be supplied with d.c. power, without any interruption, by the battery power source which serves as the second, or alternate, source of power for the inverter. Upon restoration of the a.c. power supply, the rectifier once again powers the inverter and, at the same time, recharges the batteries. Because power is always supplied from either the a.c. power or the battery power supply there is no disturbance or interruption of the a.c. output of the inverter. In a normal operation, with both power sources available, the first power source is given priority over the alternate power source by virtue of the fact that its d.c. power source has a higher effective voltage than that of the alternate battery power source. Even though both sources are available, all power is supplied by the first power source until the first source fails.

U.S. patent application No. 09/075,739 filed May 11, 1998 by Howard H. Bobry (the inventor herein) describes an alternative true UPS topology offering improved efficiency through the use of a plurality of inverters. As in the conventional dual conversion topology, priority of the power sources is determined by relative voltage levels, but in the Bobry topology priority is determined by the relationship of effective magnitudes of a.c., rather than d.c., voltages. In this description, the "effective voltage" of a power source will mean the a.c. or d.c. voltage, the magnitude of which determines its priority level for supplying supplies power for the inverter of the UPS.

In any UPS application having a battery power source, or any back-up power source whose condition may deteriorate, it is desirable to test the batteries periodically to assure that they are capable of functioning as a reliable power source in the event of a failure of the first power supply (generally a rectifier powered from an a.c. power line). Typically this test is carried out by disconnecting the first power supply from the input of the UPS, e.g., disconnecting the a.c. power lines from a utility power supply. The UPS then operates from the battery power source as it would during a real power failure. This procedure amounts to creating an artificial power failure in order to test the ability of the battery power source to provide power. While this test method is effective in that it permits an evaluation of the batteries, it carries a substantial risk of interrupting power to the load. A number of battery problems, such as loose, corroded, or open connections, or a failed or failing battery cell, can prevent the batteries from supplying the necessary power, i.e., the very act of testing the batteries to assure that power will be uninterrupted may actually result in an interruption of power with no operating back up power supply.

It is an object of the present invention to provide a method of safely testing the battery or batteries of an alternate battery power source of a UPS, and apparatus therefor, the method and apparatus being such that the battery power source is called upon to supply power as it would upon a failure of another power source, or sources, with the other power source or sources being maintained as backup so that there is no interruption of load power, caused by switching or otherwise and regardless of any failure of the batteries, even if the batteries fail abruptly and totally.

SUMMARY OF THE INVENTION

The present invention provides a test for determining the operating condition of an alternate, back-up or secondary source of power in a UPS system in which another power source functions as the primary or normal power source, with the power sources of the UPS having a priority order for supplying the load power from the UPS and at least one secondary, or alternate, power source supplying power when no other power source does so. The priority order for the respective power sources is determined by the relationship of respective effective voltages for the power sources with each power source supplying the power for the load when the effective operating voltage for the power source is higher than any other effective voltage.

In accordance with the present invention, a back-up power source which is to have its operating condition determined, normally a battery power source, is tested by changing the priority order for the power sources to make the power source to be tested first in the priority order. In the preferred embodiments of the present invention this is done by changing the relationship of effective voltages of the power sources to place the battery power source, or other source to be tested, first in the order of priority. This may be done by raising the effective voltage of the power source to be tested, by lowering the effective voltage of each power source higher in the priority order than the power source to be tested, or by a combination of both.

When the priority order is changed to render a battery power supply, or other power source to be tested, first in the priority order, the battery will immediately assume the function of supplying the load power from the UPS. However, at least one other power source, usually the power source normally first in the priority order, is still available as a back-up power source to immediately and continuously supply the load power of the UPS in the event that the battery power source, or other source being tested, fails to do so. In this manner a test of the power source is performed under actual operating conditions, just as if there had been a failure of the normally first priority power source with no interruptions or disturbance of power to the load if the power source under test fails in any way.

If the UPS has more than two operating power sources, the relationship of the effective voltages for those other than the battery power source is preferably maintained with respect to each other.

One aspect of the preferred embodiments of the invention utilizes a high order d.c. power source in which the d.c. power for supplying the power for the load is obtained by rectifying power from an a.c. power line with the rectifier output voltage being regulated or controlled between two effective voltages, one for establishing the priority of the power source for normal operations and one for establishing an effective voltage for the power source which is lower than that of the battery power source, this for testing the operating condition of a battery power source with the normally higher order source being maintained as an operating backup for the battery power source during the test.

In preferred embodiments, d.c. power sources of the UPS are connected to an inverter or inverters for providing the load with a.c. power. The non-battery direct current power sources have rectifiers which provide rectified a.c. power for the inverters and for establishing effective voltages for determining the priority of the respective power source. The effective voltage of a rectifier power source and its order of priority is changed in preferred embodiments of the invention by using a first portion of the rectifier output voltage to regulate the voltage from the rectifier to provide a first effective voltage for establishing the normal operating priority of the power source and a different portion of the output voltage to regulate the rectifier output voltage to provide a second effective voltage which changes the priority of the power source. In embodiments described, an error amplifier has a first input connected to a voltage dividing circuit connected across the d.c. output of the power source and operates to compare the voltage level of a portion of the output voltage on its first input with a reference voltage on a second input to the amplifier. To change the rectifier output from one voltage to another voltage for the battery test period, a switching circuit is provided and is operable to start and terminate a battery test period by changing the portion of output voltage of the rectifier which appears at the first input to the error circuit. This changes the output voltage of the rectifier for the power source involved. To start a test period by decreasing the voltage of the rectifier output relative to that of the battery power source, the portion of the output voltage is increased so that voltage output from the rectifier will have a lesser magnitude than that of the battery power source for the test period. At the end of the test period the switching circuit will be reset to establish the normal effective voltage for the d.c. power source. It will be understood that known or adjustable voltage control or regulating circuits may be substituted for that shown for changing the voltage of a rectifier output, or otherwise controlling the voltage setting for a higher order power source.

The testing of the battery power source may also be done by boosting the voltage of the battery so that it has an effective voltage higher than any other power source or by using a combination of boosting the effective battery voltage and lowering the effective voltage of one or more other power supplies.

These and other aspects and advantages of the present invention will be readily understood and appreciated by those skilled in the art from the following description of preferred embodiments of the best mode contemplated for practicing the invention, the description including the accompanying drawings which form a part of the description for all subject matter disclosed therein.

DETAILED DESCRIPTION OF THE INVENTION

Figure 1:
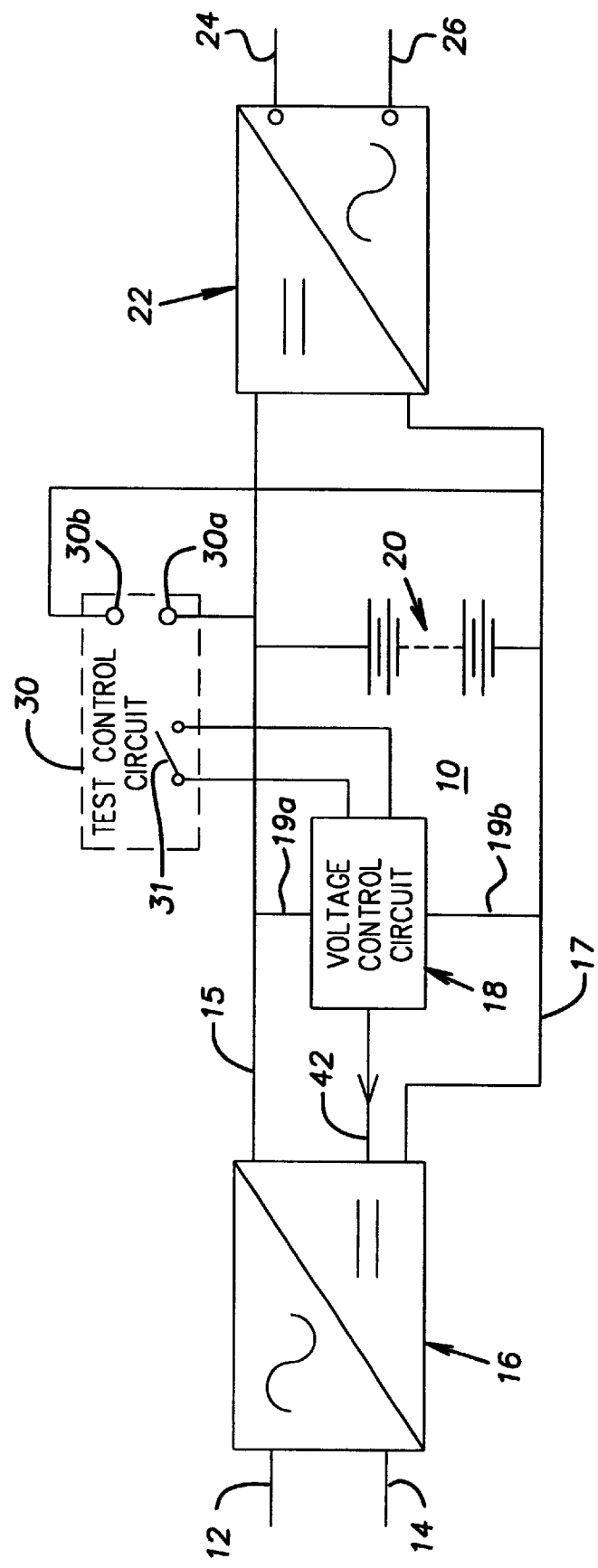
FIG. 1 is a schematic diagram of a conventional dual conversion uninterruptible power supply with battery test capability according to one embodiment of the invention.

With reference to FIG. 1, the invention is illustrated as applied to a conventional type configuration for a dual conversion (a.c. to d.c. to a.c. conversion) uninterruptible power system (UPS). While the invention is described and illustrated herein with reference to particular UPS topologies and configurations, those of ordinary skill in the art will appreciate that the present invention can be practiced with many different UPS topologies. Including topology as disclosed in the Bobry patent application previously referenced as illustrated herein.

In the embodiment FIG. 1, a UPS 10 includes a rectifier 16 connected to power lines 12, 14 from an a.c. power supply, typically power lines from a utility, for rectifying the a.c. power from the a.c. lines 12, 14 to establish a d.c. power source. The rectifier 16 has a regulated d.c voltage output on output lines 15, 17. The output lines 15, 17 are connected to the input of an inverter 22 for inverting the d.c. power and supplying a.c. load power on output connections 24, 26 for the uninterruptible power supply system. The a.c. power output from connections 24 26 for the inverter 22 are connected to a load (not shown).

In operation, the rectifier 16 constitutes a first d.c. power source of the UPS system and In practice may be a conventional rectifier circuit such as a switchmode power supply, a phase controlled rectifier, a controlled ferroresonant rectifier, a power factor controlled boost circuit, or other rectifier whose output voltage can be changed or regulated as will be understood by those skilled in the art of uninterruptible power supplies.

In the embodiment of FIG. 1, the output voltage of rectifier 16 is controlled by a voltage control circuit 18 having connections 19a, 19b which connect the circuit 18 across the rectifier output lines 15 and 17. The rectifier 16 not only constitutes a d.c. power source for supplying power to the inverter 22, but it also supplies power for charging a battery of a battery power source 20 which is also connected across rectifier output lines 15,17. The Battery power source functions as a second d.c. power source for supplying d.c. power to the inverter 22 if the rectifier 16 of the first power supply fails to do so.

Inverters for use in converting d.c. to a.c. are well known to those in the art and various types of inverters may be used to convert the d.c. power of the power sources to a.c., including the inverters shown in more detail in FIG, 5.

The voltage control circuit 18 maintains the output of rectifier 16 at a predetermined voltage higher than the battery power source to supply power to the inverter in preference to the battery and to maintain a state of full charge on the battery 20. The rectifier voltage may be varied to accommodate different types of batteries, and may be further adjusted according to battery temperature or other variables, but such adjustments are well known in the art and need not be described for the purposes of understanding or practicing the present invention from the description herein.

While the output voltage of rectifier 16 remains at some voltage higher than the open circuit voltage of the battery 20, the battery does not discharge. Upon failure of power to the rectifier 16 of the first d.c. power source, the rectifier no longer supplies power and the voltage across the battery 20 from the rectifier will drop and the fully charged battery will now supply power over the lines 15, 17 to the inverter 22. With the battery supplying power, the voltage of the battery will drop from its fully charged voltage to discharging voltages as the battery supplies power to the inverter 22. If, for example, the battery is a nominal 48 volt battery, having a 48 volt open circuit voltage, the voltage of the rectifier may be, for example, 52 volts for supplying power to the inverter and charging the battery. Upon failure of the rectifier, the first d.c. power source, the battery will begin to discharge and its voltage will drop quickly to about 45 volts, and eventually drop further to 42 volts when it is almost completely discharged. Upon restoration of the power to the first d.c. power source, the rectifier will resume operation and restore the battery voltage to about 52 volts as the battery is recharged. Note that these voltages are exemplary and will vary with the type and size of battery, temperature, and other factors.

It is noted that no switching devices or logic circuits are required to determine whether the inverter receives d.c. power from the first source (the rectifier 16) or from the second source (the battery). Also, it is to be noted that the power source for normally supplying the load has a voltage higher than any other power source and will automatically have priority over another source with a lower voltage to supply the load power, each other power source automatically becoming the priority power source and assuming the supplying of power for the load if its operational voltage becomes the voltage higher than any other source. Normally the battery power source is the power source having a voltage lower than any other power source, i.e., the first power source in a UPS have only two power sources, and the battery power source is always available instantly and automatically to provide power to the inverter upon failure of the first source, and any other source of higher order, without any interruption or disturbance.

Heretofore, it has been possible to test the ability of the battery to supply power to the inverter only by disabling the rectifier. This is typically done by removing the power to the rectifier to determine whether the battery is capable of supplying power in the event power from the rectifier fails. Thus it has been the practice to fail the power from any power source of the UPS system except the battery power source to be tested. This runs the risk that the battery will fail initially or during a test period without any backup power source, thus causing the inverter, and the critical load, to loose power.

The present invention accomplishes a test of the battery power source, not by failing the source or sources having priority over the battery, but, rather, by changing the priority order of the sources. For test purposes, what is normally the second power source, i.e., the battery in the embodiment of FIG. 1, becomes the preferred source, and what is normally the first power source (the d.c. power from the a.c. power line) becomes the secondary source of power in the event the battery fails. In accordance with the present invention for testing the battery power source, both the power sources of the UPS system remain available, and a failure of the battery under test will not result in loss of power to the inverter, but, rather, operation will continue with power from the a.c. power line via the rectifier.

This change of power source priorities may be accomplished in the apparatus of FIG. 1 by using the voltage control circuit 18 to adjust the rectifier voltage to a point below the normal discharge voltage of the battery with the lower voltage for the first power source having a level high enough to assure proper operation of the inverter. With the exemplary voltages previously noted for the battery (48 volts fully charged) and the rectifier voltage (52 volts), the rectifier voltage for the test period may, for example, be set to 43 volts. This voltage is below the open circuit voltage of the nominal 48 volt battery, and is in fact below the 44 to 45 volt level which the battery will maintain for most of its discharge period, but is above the 42 volt level at which the discharge of the battery normally ends. Consequently, if the battery is supplying the power, the rectifier of the first voltage source will assume the supplying of load power if the battery voltage drops to 43 volts before the battery reaches a discharged voltage of 42 volts. Thus, upon the reduction of the rectifier output to 43 volts to initiate a battery test period, the battery automatically assumes the supplying of power to the inverter and if the battery fails to supply this power, even if the battery fails abruptly and completely, the rectifier remains available and will resume supplying power to the inverter with no switching or control circuit action required. This accomplishes the goal of providing a safe battery test without risk that the failure of the battery will result in failure of power to the inverter and thus the load.

To terminate the battery test, the voltage control circuit 18 is reset to its normal setting for establishing priority over the battery and recharging the battery to return the UPS system to its normal operation. A battery test is initiated and terminated by the operation of a test control circuit 30.

Figure 2:
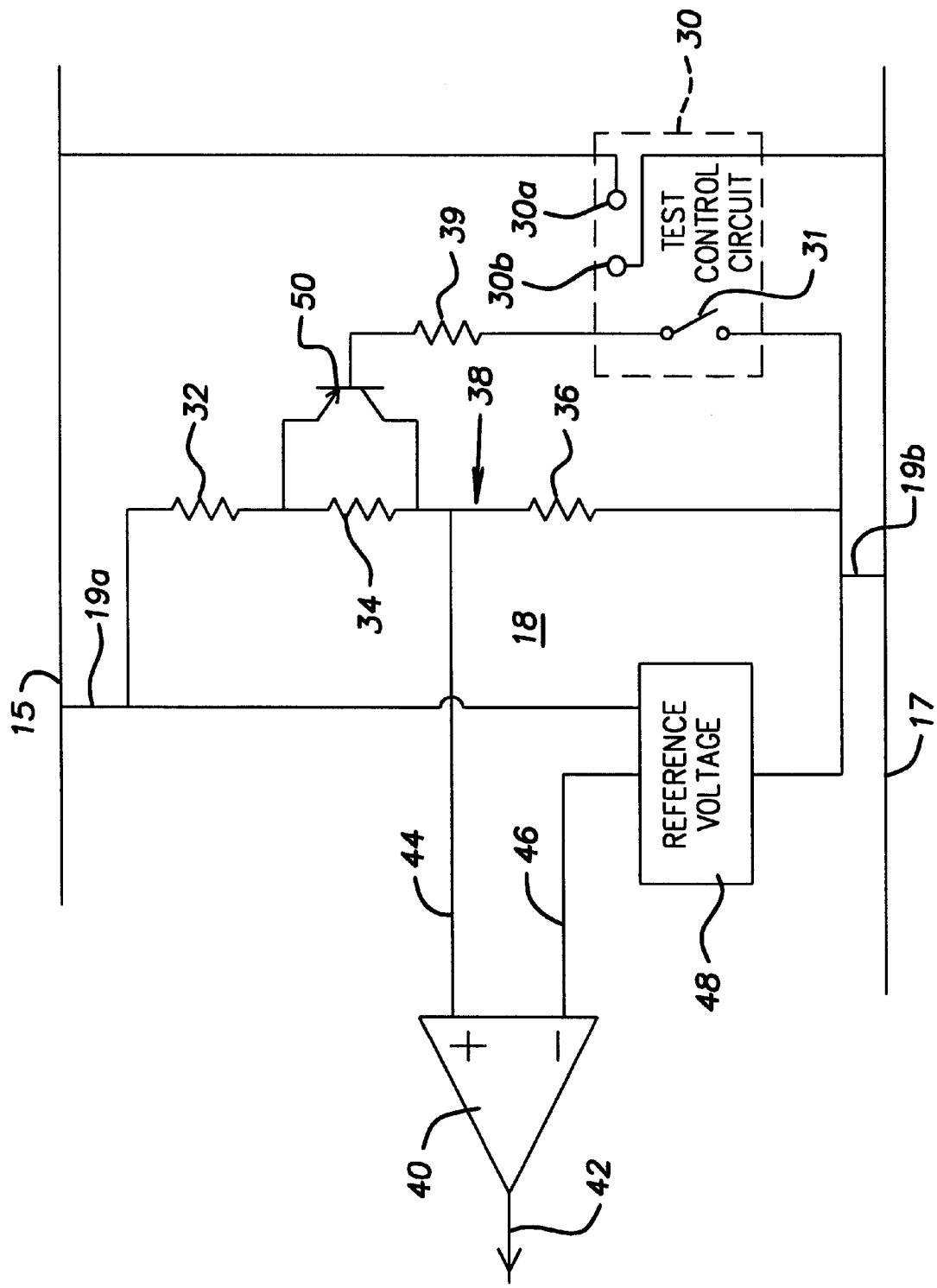
FIG. 2 is a schematic diagram of a voltage control circuit useable in the embodiment of FIG. 1.

A suitable voltage control circuit for the voltage control circuit 18 is illustrated in FIG. 2. including battery test circuitry 30 for initiating a battery test period.

The voltage control circuit 18 of FIG. 2 is connected to the rectifier output lines 15, 17 by the connections 19a, 19b, and comprises a voltage dividing circuit comprising resistor 32 connected to the line 19a, and in series with the resistors 34, 36 with the resistor 36 being connected to the line 19b to provide a voltage divider circuit 38 connected across the output of the rectifier 16.

The voltage regulating circuit 18 of FIG. 1 is of a conventional type which comprises an error amplifier 40 having an output connection 42 to the rectifier 16 for regulating its output, in a conventional manner, to a predetermined voltage which essentially maintains zero voltage at the output of the error amplifier. The error amplifier has an input 44 connected to the voltage divider 38 between the resistor 34 and the resistor 36 to establish a first portion of the rectifier output voltage on the input 44 of the error amplifier. The error amplifier also has an input 46 from a reference voltage circuit 48. The reference voltage applies a bias to the amplifier to establish an error signal which is driven toward zero output by the voltage on input 44 and approaches essentially zero output as the voltage on input 44 to the amplifier approaches the voltage level of the reference voltage. If the reference voltage were to be preset to the desired rectifier voltage and the full rectifier output voltage applied to the input 44, the rectifier would be regulated to that voltage. However, the voltage divider tap for the input 44 applies a fractional portion of the voltage across the voltage divider, and the error signal will approach zero when the output voltage portion at the input 44 approaches a voltage level which is the same as the reference voltage. This regulates the rectifier 16 to an output voltage that keeps divider voltage at the input 44 for the error amplifier at essentially the reference voltage, The voltage to which the rectifier is regulated for a given reference may be increased or decreased by changing the fractional portion of the divider voltage for the input 44 of the error amplifier.

Since the error amplifier has a fractional portion of the rectifier output voltage on its input, the output voltage of the rectifier can be changed by changing the fractional portion of the output voltage at the input 44 so as to regulate the rectifier to a different voltage output for establishing the reference voltage at the voltage divider tap for input 44 to the reference voltage circuit.

For purposes of establishing a test period for the battery power source, a transistor 50 is connected across the resistor 34 and a normally open switch 31 of the battery test circuit 30 is closed to initiate a battery test period in which the rectifier output is operated at an effective voltage below that of the battery power source. The closing of the switch 31 closes the open base circuit of the transistor 50 through current limiting resistor 39 and the transistor operates to short the resistor 34 out of the voltage divider 38, leaving only the resistors 32 and 36. This establishes a larger portion of rectifier output voltage at the input 44 to cause the rectifier output voltage to drop below the effective voltage of the battery.

Thus, with proper selection of the relative values of the resistors 32, 34 and 36, the circuit will cause the rectifier voltage to drop to its appropriate level for the battery testing period when the switch 31 is closed. When the switch is open, transistor 50 is rendered nonconductive and the rectifier output voltage is restored to its normal, non-battery test, level. This test mode may be controlled by a test control circuit composed of a digital or mechanical timer, a microprocessor, or any other control device known in the art which will serve the intended purpose of closing and opening the switch 31 to respectively initiate and terminate a battery test cycle. The test control circuit may also be operated remotely via the use of a relay, modem, or other suitable device.

To illustrate the operation of the voltage control circuit and the selection of resistor values using the previous exemplary voltages for the rectifier of 52 volts for normal operation and 43 volts to give the battery priority, the fractional portion for operation at 43 volts will be Rv/43 where the Rv is the reference voltage. If the reference voltage is 38.5 volts then the fractional portion of the rectifier output on input 44 will be 38.5/43 or 0.895, or about 90%, and the resistor 32 is about 10% of the resistance in the voltage divider 38.

For normal operation with the rectifier supplying the power at 52 volts, the fractional part of the output will be to be 38.5/52, or 74% of the output voltage. Thus if one assumes that the divider bridge is 1000 ohms, then resistor 36 provides 740 ohms of the resistance of the divider bridge and the resistance of resistors 32 and 34 constitute 260 ohms.

In the battery test with only resistors 32 and 36 in the voltage divider, the resistor 36 constituted 90% of the resistance of the voltage divider. Accordingly, the total resistance of divider for battery operation is 740/0.9 or 822 ohms with the resistor 32 being 740/9, or ~82 ohms. However, when operating at 52 volts, it was determined that together the resistors 32 and 34 resistor would have 260 ohms resistance and since resistor 32 has been determined as being 82 ohms, the resistor 34 has a value of 178 ohms.

Figure 3:
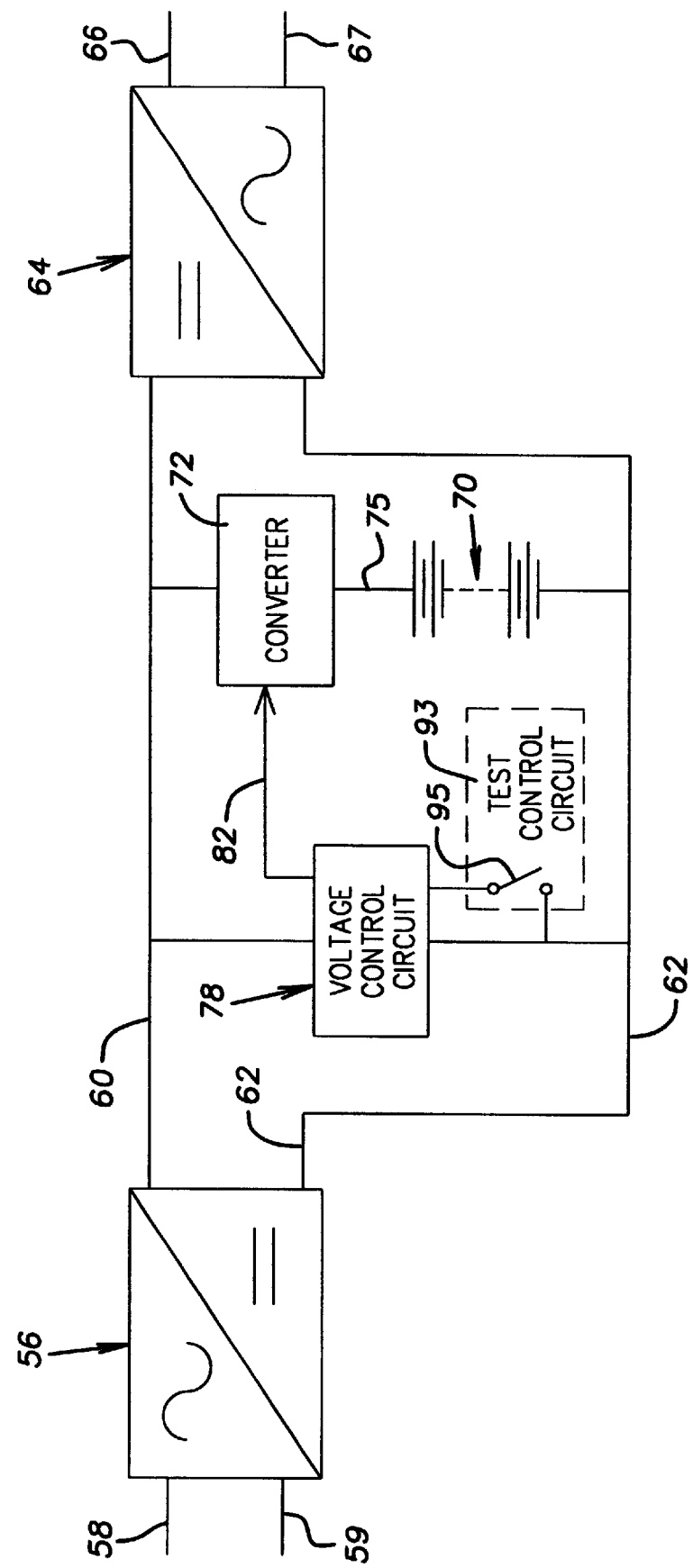
FIG. 3 is a schematic diagram of a conventional dual conversion uninterruptible power supply with battery test capability according to another embodiment of the invention.

In the embodiment of FIG. 3, the UPS system comprises a rectifier 56 for rectifying power supplied power from a.c. power lines 58, 59 and has its output connected by lines 60, 62 to the input of an inverter 64, which in turn has output lines 66, 67 for supplying power to a load. The rectifier 56 is preferably a conventional voltage regulated rectifier and may be the rectifier of FIG. 1 having the voltage regulating error amplifier of FIG. 2 incorporated therein to regulate the output of the rectifier to a predetermined voltage, e.g., 52 volts. The embodiment of FIG. 3 also has a battery power source 70 and a conventional converter 72 for boosting the voltage of the battery connected in series with the battery across the output lines 60, 61 of the rectifier to function as a second d.c. power source for the inverter. The output of the converter 72 is connected to the input line 60 for the inverter and the battery output 75 is connected to the input of the converter.

In operation, the rectifier 56 is a conventional regulated rectifier well known in the art and is preferably regulated to maintain the output of the rectifier at a predetermined voltage, again say 52 volts, and is the preferred power source for supplying power. However, there is no change of rectifier voltage to initiate the battery test period or during the battery test period. Instead, the voltage from the battery 70 is raised to an effective voltage which establishes the battery as the priority power source for supplying load power.

As illustrated in FIG. 3, the effective voltage of the battery power source may be regulated by a voltage control circuit 78 connected across the rectifier output lines 60, 62, the voltage control circuit 78 having an output on a connection 82 to the converter 72. If there is to be no voltage regulation of the battery power source, the converter 72 has two settings. The first setting which effectively provides a flow through path for the battery power and a second setting which effects a boosting or multiplying of the battery voltages to a level greater than the voltage output of the rectifier 56. However, it is often preferred in dual conversion UPS topology to provide inverter 64 with a well regulated d.c. input voltage from the battery power source 70 in order to improve inverter efficiency and regulation To provide regulated d.c from the battery, the voltage control circuit 78 may regulate the converter to produce a regulated output voltage, which may be lower or higher than the battery voltage as is well known to those in the art, e.g., a conventional boost converter will produce a regulated output voltage higher than the battery voltage and may be used in the embodiment of FIG. 3. However, other conventional and known circuits for increasing and regulating a d.c. voltage may also be used as the regulating converter as would be apparent to those in the art from the description herein.

Figure 4:
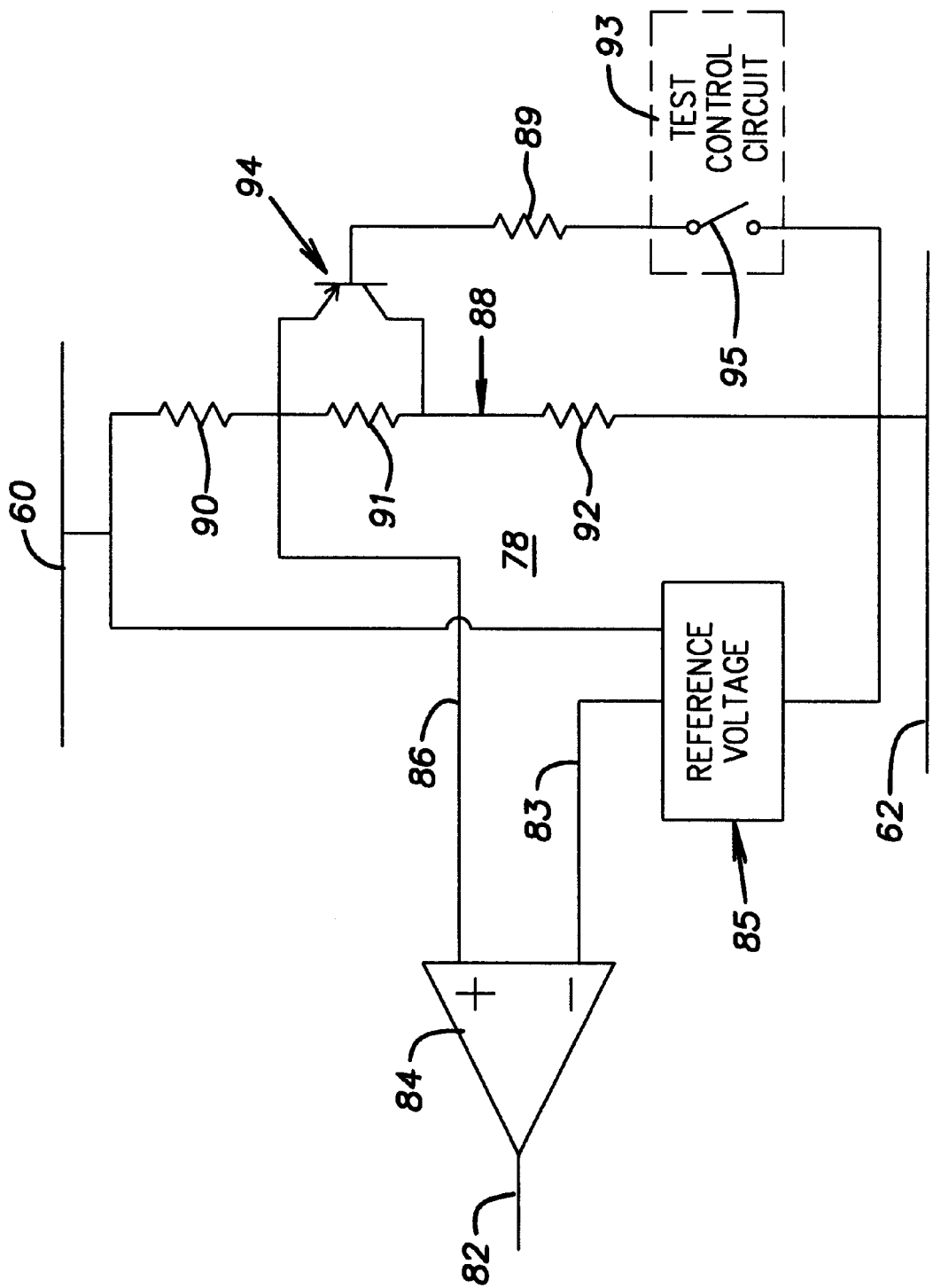
FIG. 4 is a schematic diagram of a voltage control circuit as used in the embodiment of FIG. 3.

The voltage control circuit 78 for regulating the converter 72 of the embodiment FIG. 3 is shown in more detail in FIG. 4. The circuit is basically the same as to that shown in FIG. 2 and comprises an error amplifier 84 which has an output connection 82 to the converter, an input 83 connected to the output of a reference voltage circuit 85, and an input 86 connected to a voltage divider 88, the voltage divider being connected across the lines 60, 62 for the output of the rectifier 56. The voltage divider 88 has a resistor 90 which is connected to the output line 60 for the rectifier, the resistor being connected in series with a resistor 91 and a resistor 92, with the latter being connected to the rectifier output line 62. The input 86 to the error amplifier 84 is connected to the voltage divider between resistor 90 and resistor 91 so that the voltage at input 86 has a voltage level which is a fractional portion of the rectifier voltage, i.e. the voltage portion across the resistors 91 and 92.

The circuitry illustrated in FIGS. 3 and 4 also includes the test control circuit 93 and a test control switch 95.

The operation of the embodiment of FIGS. 3 and 4 will be further described using exemplary voltages, as in the description of FIGS. 1 and 3. It will be assumed that the output of the rectifier 56 is 52 volts and that the fully charged battery power source has a voltage of 48 volts and a discharge voltage of 44 volts and is effectively discharged at 42 volts. It is further assumed that the battery output is to be regulated to 48 volts and, for battery test purposes, the battery is to have an output of 54 volts to give the battery power source priority over the rectifier for supplying power to the load.

To initiate a test for the battery by boosting its voltage to about 54 volts, a transistor 94 connected across the resistor 91 is rendered conductive to provide a short circuit path around the resistor 91 for current in the voltage divider to decrease the fractional portion of the divider on the input 86 to the error amplifier. This is done by closing a switch 95 in the base circuit of the transistor 94 with base current limited by resistor 89.

When regulating at 48 volts the fractional portion of the voltage at input 86, with the illustrative reference voltage of 38.5, is 38.5/48, or 80%, of the output voltage from the converter to the inverter with the resistors 91, 92 constituting 80% of the voltage and resistance of the voltage divider 88, and the resistor 90 constituting 20% of the total resistance all three resistors. Thus the resistance of resistor 90 is 200 ohms, if it is again assumed that the the resistance of the three resistors total 1,000 ohms, and the resistors 91 and 92 have a combined resistance of 800 ohms.

When regulating to 54 volts with only two resistors, the resistor 91 being shorted out, the voltage on input 86 of the error amplifier 84 is 38.5/54 or 71% of the voltage across the voltage divider. Thus the resistor 92 constitutes 71% of the voltage for regulation to 54 volts. Since the resistor 90 has been determined to be a 200 ohm resistor and constitutes 29% of the resistance when the regulating to 54 volts, the resistor 92 (71%), has a resistance of 200/29×71, or 490 ohms, and constitutes 29% of the divider voltage. And with resistors 91 and 92 constituting 800 ohms for regulating at 48 volts, the resistor 91 has a resistance of 310 ohms.

Thus the voltage divider 88 includes a resistor which is removed from the voltage divider such that, when transistor 94 is made conductive, the voltage at the error amplifier input is reduced, rather than being increased as was the case in FIG. 2. In this case, when the transistor is turned on, the error amplifier output 84 commands an increase in the output voltage of converter 28 until the difference between the error amplifier inputs again approaches zero. As is the case for the circuit of FIG. 2, the test mode may be controlled manually via a switch 95, or otherwise controlled by the test control circuit 93.

Figure 5:
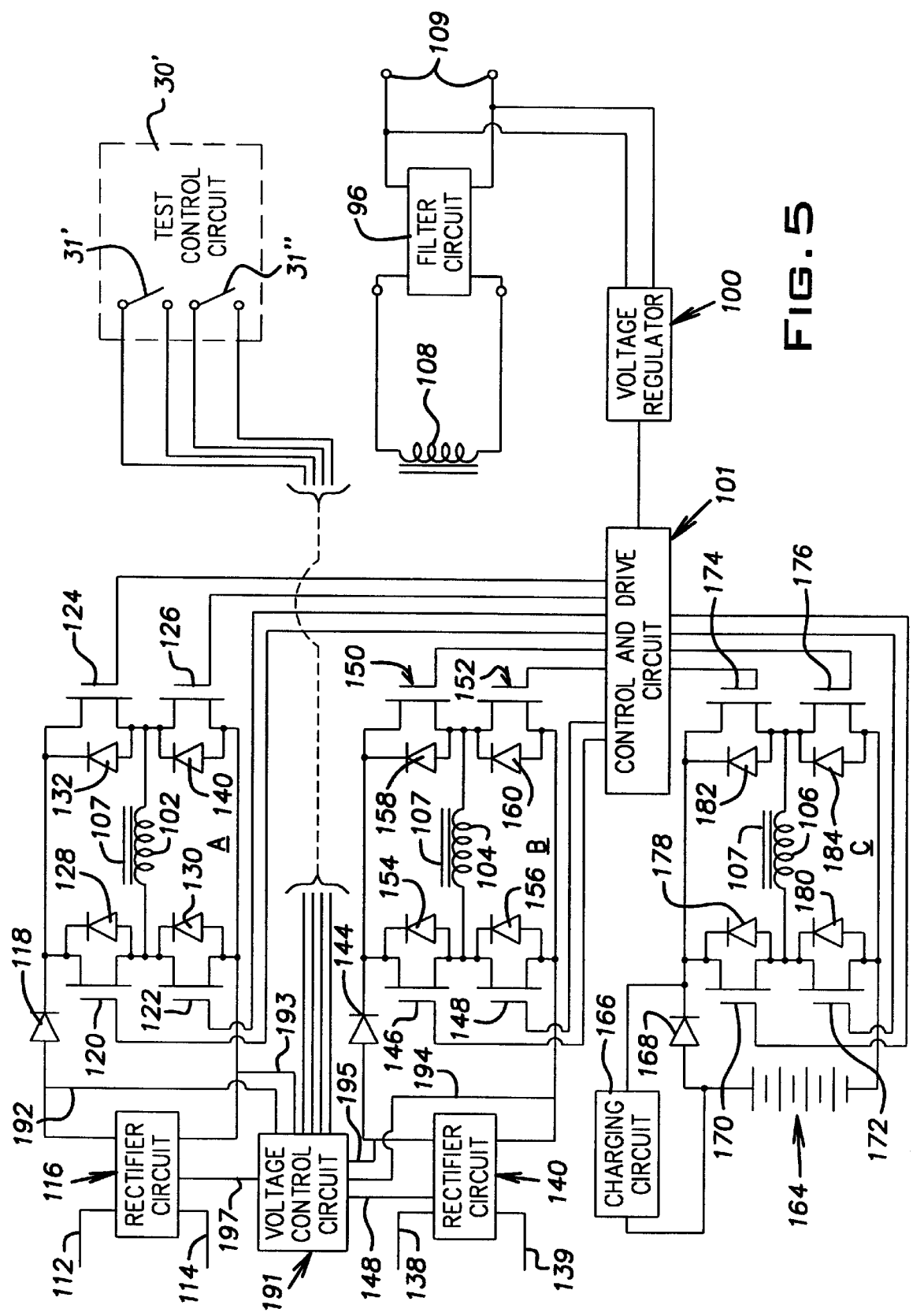
FIG. 5 is a schematic diagram of an uninterruptible power supply according to Bobry with battery test capability according to yet another embodiment of the invention.

The embodiment of FIG. 5 is a true UPS topology having more than two power supplies and a respective inverter for each d.c. power source provided by the respective power supplies as described in the aforesaid Bobry patent application. In the embodiment of FIG. 5, The UPS apparatus is shown as having two independent a.c. power supplies which supply power to respective rectifiers 116 and 140 over a.c. power lines 112, 114 and 138, 139, respectively. The rectifiers provide first and second d.c. power sources for the UPS and the rectifiers may be conventional rectifier circuits such as a switchmode power supply, a phase controlled rectifier, a controlled ferroresonant rectifier, a power factor controlled boost circuit, or any other suitable rectifier known in the art. The rectifiers need not incorporate isolation means, as isolation of the power supplies from each other and the output will be provided by the UPS apparatus described.

The UPS of FIG. 5 also has a battery, or bank of batteries, 164, consituting a third d.c. power source for the UPS. The three d.c. power sources 116, 140, 164 are connected to the inputs of respective separate inverters A, B, and C, the outputs of which are connected to separate transformer primary windings 102, 104, and 106. The primary windings have a common core 107 and a common secondary winding 108 with the secondary winding being connected through a conventional filter 96 to output terminals 109 which are connected to a load, not shown, for the UPS.

A voltage regulator 100 for the output of the UPS is connected across the output terminals 109 and the output of the regulator 100 is connected to the input of a control and drive circuit 101, which operates the inverters in phase synchronization and controls the output voltages of the inverters in response to the voltage regulator 100.

Referring to the first power source, i.e. rectifier 116, the d.c. output current of the rectifier 116 is conducted through a diode 118 to the inverter A which is comprised of transistors 120, 122, 124, and 126. Inverter A is of conventional design. In inverter A, transistors 120 and 126 are rendered conductive to provide one half cycle of the output of the inverter and transistors 122 and 124 are rendered conductive to provide the alternate half cycle. The purpose of diode 118 is to prevent a backwards, or reverse, flow of current from the inverter to the rectifier, and may not be necessary with some rectifier designs. Where diode 18 is not required, it may simply be omitted. The inverter also comprises diodes 128, 120, 132, and 134 connected respective transistors to provide paths for reverse current flow through the inverter, thus allowing operation in all four quadrants so that the inverter may power reactive loads, as is well known and understood. These diodes may be separate and discrete components, or may be integrated with transistors 120, 122, 124, and 126.

The output of inverter A drives the transformer primary 102. The primary 102 and the transformer secondary 108 along with the common core are shown spaced in the schematic, as is conventionally done.

In the second power supply for the UPS, the output of the rectifier circuit 140, supplies d.c. current, through (optional) diode 144, to the input of an inverter B comprised of transistors 146, 148, 150, and 152, and diodes 154, 156, 158, and 160, which operate as described for the corresponding transistors 120, 122. 124, and 126, and corresponding diodes 128, 130, 132, and 134 of inverter A.

The output of the second inverter B drives its separate primary winding 104. As noted with respect to primary 102, the transformer primary winding 104 is associated with the common core 107 and secondary winding 108

The third inverter circuit C for the battery power source follows the structure of the other inverters and is comprised of transistors 170, 172, 174, and 176, and diodes 178, 180, 182, and 184. The connection from the battery to the input of the inverter circuit is shown as having a diode 168. This inverter drives the third transformer primary 106 associated with the common core 107 and common secondary winding 108.

A battery charger circuit 166 is connected across the diode 168 to be powered by current flowing from the primary winding 106 through the inverter C to the battery charger circuit when the UPS is powered by either the first or the second a.c. power source. As explained in more detail hereafter, when the UPS supplies power through either the first or second inverter, the primary winding 106 will have a secondary to primary transformed voltage thereon which will back bias power flow from the battery. This back biasing voltage will also operate through the inverter C to supply power to the battery charging circuit to keep the battery charged. This powering of the battery charging circuit is such that it does not interconnect the inverters or their power supplies, nor does it affect the isolation of the inverters and the UPS output since the back biasing voltage is established on the primary 106 by transformation of the output voltage of the secondary as will be well understood, from the description herein and the drawings, by those in the art. As an alternate, a separate battery charger operating independently of the inverter circuits may be provided (not shown).

All three inverter circuits are driven in synchronization with each other by a control and drive circuit 101 in a manner well known in the art so that each inverter produces the identical wave form as the other two inverters, differing only in magnitude. The inverter wave forms may be a simple square wave, or may be a pulse width modulated wave form which is controlled to provide a regulated output voltage and/or a desired output wave shape. The filter circuit 96 between the secondary winding and the output terminals 109 may be used to further control the shape of the output wave form produced at output terminals 109. The filter circuit may be a simple LC circuit comprised of a series inductor and a parallel capacitor, or may be a more complex circuit as required by the specific application. For some applications, the filter circuit may be omitted.

The control and drive circuit 101 may be isolated from the inverters and the UPS output via the use of isolation transformers, optical couplers, or other suitable means well known in the art. Similarly, isolating means may be used to supply power to the control and drive circuit 101 from each of the power supplies for the UPS. As is conventional practice, connections (not shown) are made to the power lines for the rectifiers and the battery 164 to establish individual d.c. sources (not shown) for powering the control and drive circuit. The outputs of these d.c. sources are ORed in a well known manner to supply to the control and drive circuit whenever one or more of the power supplies for the UPS are available, i.e., are functional to supply power.

While inverters A, B, C, have been described as having the same design, and operating in the same manner, it will be understood that the transistors and the inverter designs for the inverters may be different to maximize the efficiency of the respective inverters at the applied voltage.

The secondary transformed voltages for the power sources of the UPS constitute effective voltages for the respective d.c. power sources for purposes of establishing a priority order for the power sources to supply the power from the UPS. For this purpose the transformation ratios for the primaries 102, 104, 106 for the respective power sources are such as to provide secondary effective voltages of magnitudes which are different from each other and which in this embodiment, approximate the desired output voltage for the UPS. It is be understood that with voltage regulation, the effective voltage for one or more power sources, may be, for example, higher than an approximate to the load voltage, and regulated down to the voltage for the load.

The relative magnitudes of the effective voltages will determine the order of preference in which the respective d.c. power sources operate to supply load power from the UPS. The most preferred d.c. source, i.e. the one chosen for normally supplying power from the UPS, has a transformed effective voltage higher than that of any other and operates to reverse bias all other d.c.sources, with each other d.c. power source assuming the function of supplying power to the load through the UPS when its effective voltage becomes higher than any other and it will continue to supply power for the load power and reverse bias any lower order power supply until a d.c. power source of higher order reestablishes a higher effective voltage.

As noted above, the UPS output will, at any time, normally be powered by the preferred inverter, when it is available, because it is the one having an effective voltage higher that any other d.c.power source. This effective voltage will cause all other primaries to reverse bias their power sources, whether rectifiers or batteries, or any other type of d.c. source, and prevent the power sources from supplying current to their respective inverters. If the preferred power source fails, another inverter and its power source becomes the most preferred and automatically and naturally, without any action by a control circuit, provides the power for the load. This operation is similar to the use of diodes to "OR" d.c. power sources together to supply power to an inverter so that the power source having the highest voltage will supply power to the load but upon failure of that voltage source the voltage source having the next highest voltage will assume the load. By using an inverter for each power supply and effectively OR-ing together the transformer outputs for the inverters, the power supplies or sources for the inverters may be isolated from each other as well as from the a.c. output of the UPS to allow, for example, the use of low voltage batteries as one power source which are safely isolated from a high voltage power line used as another voltage supply. As will be understood by those skilled in the art from the foregoing, this isolation may be accomplished since each primary winding is dedicated to one d.c. power source and the inverter for that power source and there need not be any connections between inverters. In addition, the rectifiers will block any feed back from the primary windings when a primary is back biasing its corresponding d.c. source.

In the embodiment of FIG. 5, adjustment of transforming ratios allows any desired order of preference for the power sources to be set by design, even to render as the most preferred power source, one which has a lower voltage than a lesser preferred power source. For example, a most preferred power source may be from a first a.c. power line which is of lower voltage than a second a.c. power line of higher voltage but which is preferred only as an alternate to the first power line.

An example may provide useful clarification of circuit operation in the embodiment of FIG. 5. Assume that the first rectifier circuit 116 produces a regulated d.c. output of 400 volts, (the rectifier may provide d.c. power either lower or higher than the a.c. supply). Further assume that the UPS output is to be a 60 volt square wave, typical of that required for powering broad band communications networks over coaxial cable. The inverter comprised of transistors 120, 122, 124, and 126 will provide a 400 volt square wave across transformer primary 102, while a 60 volt square wave is desired across transformer secondary 108. This is accomplished by setting the primary to secondary turns ratio in accordance with the transformer equation:

$$V_p/V_s = R_{ps},$$

where V is voltage and subscript p indicates primary, s indicates secondary, R is turns ratio and subscript ps indicates primary to secondary turns ratio. Accordingly the $R_{ps}$ for the first transformer with 400 volts on the primary, and a secondary voltage of 60 volts, will be 400/60, or 6.66/1.

Assume that the second rectifier circuit 140 produces a regulated d.c. output of 360 volts. The turns ratio between the second transformer primary 104 and the transformer secondary 108 should be 360/60, or 6.00/1. Similarly, assuming the nominal voltage of the battery 164 is 48 volts, the turns ratio between the third transformer primary 106 to establish 60 volts on the secondary should be 48/60, or 0.80/1 so that a 60 volt output can be supplied from the 48 volt battery.

With the computed turns ratios the secondary voltage for all three inverters and transformer primaries have the same secondary voltage. Thus none would be higher than any other and the turns ratios need adjusting to provide different effective voltages to define the priority order for the power sources. As we have assumed, the first rectifier circuit 116 provides a 400 volt d.c. source for the first inverter. This, in turn, produces a 400 volt a.c. square wave across transformer primary 102, resulting in a 60 volt a.c. square wave across the secondary 108 for all primary windings. With a primary to secondary turns ratio of 6/1 for the second primary winding 104 and a secondary voltage of 60 volts from the first power source on the secondary 108, the voltage across the primary 104 for inverter B, as given by the above equation, will be Vp $(360)=V_s(60) \times R_{ps}(6/1)$, or 360 volts.

Thus, with the assigned turns ratio, the voltage from the first power source of 60 volts on the secondary will provide the same voltage on the primary winding 104 as does the rectifier 140. However, a slight difference in voltage at either the first rectifier 116 or the second rectifier circuit 140 would determine which of the two sources would supply the load, but it is preferred that the first power source supply power for the load when it is available. This can be assured by slightly adjusting the turns ratio for the second primary winding 104 for the inverter B. By making the turns ratio 6.10/1, rather than 6.00/1, the secondary voltage for 360 volts on the primary 104 will be 360/6.10, or 59 volts. This is lower than the 60 volts secondary voltage when the first power source is supplying the power. However, the secondary voltage of 60 volts for the first primary 102 is now transformed to the second primary 104 with the primary to secondary ratio of 6.10/1 and the above equation now becomes $V_p=60 \times 6.1$, and a voltage of 366 volts is established across the primary 104 of the inverter B. This exceeds the 360 volt level of the output of the second rectifier circuit 140, so no current will flow from the rectifier 140. All of the power required will be supplied by the first power source, as desired. If the rectifier 116 fails, power will then flow from the second rectifier 140. With the primary/secondary turns ratio for the second primary 104 at 6.10/1, the secondary effective voltage of the second power source is 360/6.10, or 59 volts and the second rectifier will operate to supply power for the load when the voltage on its secondary is 59 volts or slightly less. This does not provide the 60 volts desired for the load, but this will be discussed in more detail later.

Similarly, the 60 volt level from the first primary 102, when it is available, is across the secondary for the primary winding 106 energized by inverter C. With the assumed battery voltage of 48 volts and an assigned primary to secondary ratio of 0.8/1, 60 volts on the secondary of the third transformer would transform to the primary as 48 volts across the primary winding for the battery, which is again the same as the assumed nominal voltage of the battery. This again needs to be adjusted slightly to prevent power flow from the battery at 48 volts as was done for the second power source. By making the primary to secondary turns ratio 0.83/1, the secondary voltage from the battery will be 57.8 volts. This is lower than the secondary 59 volts from the primary winding 104 for the inverter B.

With the primary/secondary turns ratio for the battery power source, when the secondary voltage is 60 volts from the primary winding 102, the voltage across the battery transformer primary 106 will be 49.8 volts to reverse bias the fully charged battery power source of 48 volts. Also when the primary winding 104 is operating because the 60 volts from the primary winding 102 has failed, the voltage on the primary winding 106 for the battery power source will be ~49 volts to back bias power from the battery power source. It will be noted that the battery charging circuit is connected between the diode 168 and the inverter C so that the charging circuit will be energized to charge the battery when either the first or second primary 102, 104 is operating to provide the secondary voltage.

Thus the UPS of FIG. 5, with the voltages and turn ratios assumed, will have an output voltage which will vary from 57.8 volts (battery) to 60 volts (first primary), depending upon the power source. While this may be satisfactory for many applications the voltage regulator 100 will provide a better regulated output voltage. As noted, the battery will not operate at a constant 48 volts as has been assumed so far in determining primary to secondary turns ratio. The battery voltage will, in fact, typically vary from about 48 volts at full charge to about 42 volts when fully discharged. When operating from a discharged battery at 42 volts with the assigned turns ratio, the secondary voltage is ~50 volts. The output voltage of the UPS could thus vary from 60 volts to ~50, volts depending on which power source is being used and the state of the battery.

A regulated output, constant regardless of the power source or state of charge of the battery, is provided through the voltage regulator 100. The voltage regulator 100 may be one which utilizes pulse width modulation. Using pulse width modulation in a well known manner, the voltage regulator circuit 100 monitors the output voltage of the UPS and controls the duty cycle of the inverters to maintain a constant and well regulated output voltage as is well understood by those working in the art.

Figure 6:
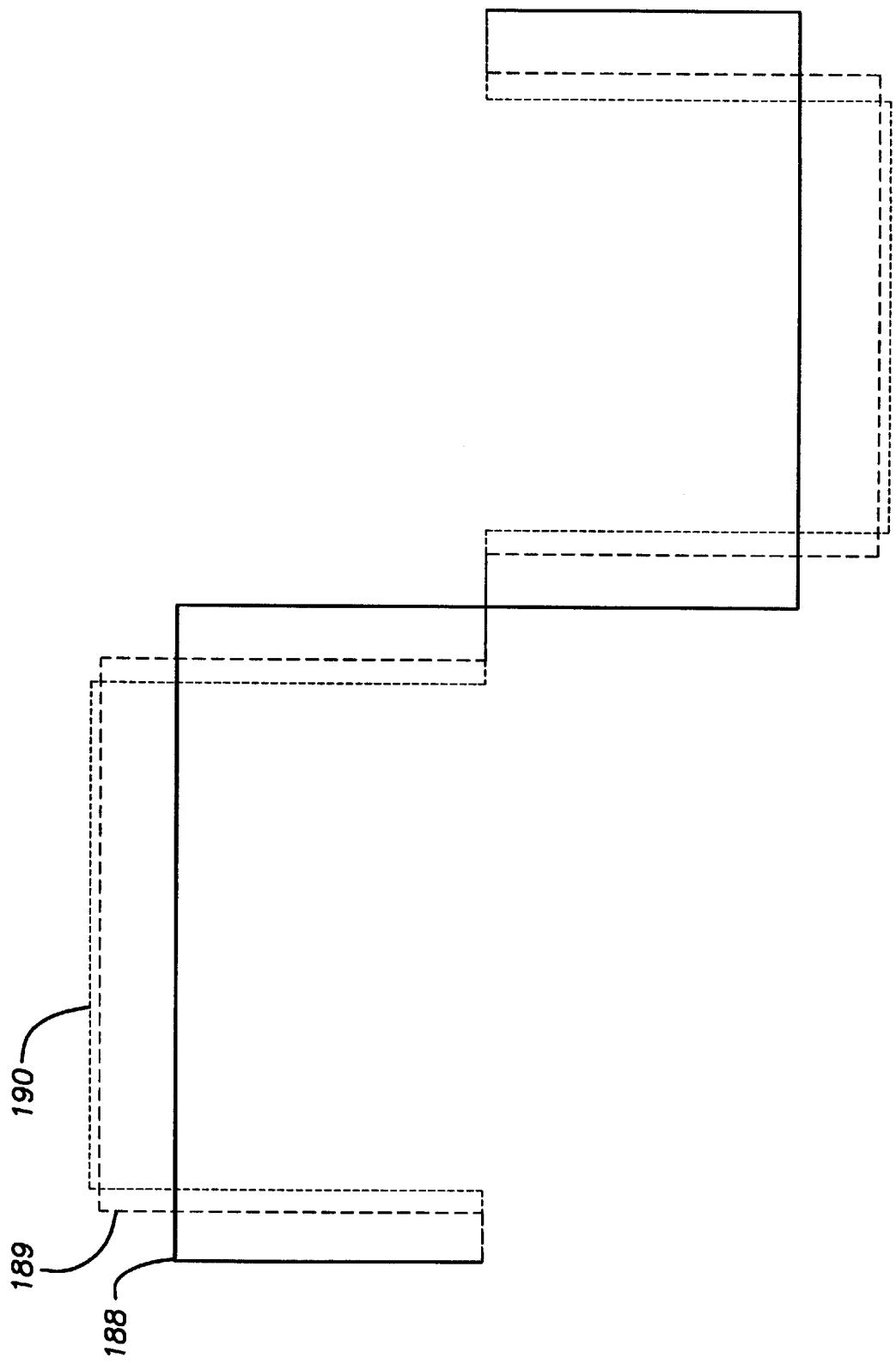
FIG. 6 is a diagram of output wave forms for inverters shown if FIG. 5.

FIG. 6 illustrates the inverter voltage wave forms resulting from the use of pulse width modulation. As is conventional, each half cycle of the wave form may be comprised of a single pulse, either positive or negative on alternating half cycles with the instantaneous voltage of the inverter being controlled by changing the width of the pulse whereby the instantaneous voltage during each half cycle of the inverter is either positive or negative, or zero as shown in FIG. 6.

With reference to FIG. 6, a voltage wave form 188 as shown would appear across transformer secondary winding 106 when the UPS is operating from battery at its low voltage, such as 42 volts in the given example. Wave form 189 of FIG. 6 is a typical voltage wave form which would appear across the transformer secondaries when the UPS is operating from the second power source, rectifier 140, and wave form 190 is a typical voltage wave form which would appear across the transformer secondaries when the UPS is operating from the first power source, rectifier 116. While the three voltage wave forms shown in FIG. 2 differ in shape, voltage regulator circuit 100 is used to adjust pulse width so as to maintain a constant voltage output at terminals 109. Such regulator circuits are well known and no further description is necessary to those working in the art. The filter circuit 96 will function to assure that the output voltage wave form approximates a square wave, or a sinusoidal wave form, or such other wave form as may be desired in a specific application.

It will be understood by those versed in the art that the desired regulation by pulse width modulation may also be achieved by varying the widths of multiple pulses per half cycle, as is well known.

To test the condition of the battery power source in the embodiment of FIG. 5, a voltage control circuit 191 may have two control circuits, each as is shown in FIG. 2, to provide a separate voltage control for each of the rectifiers 116, 140. The voltage control circuit 191 has inputs 192, 193 connected across the output of the rectifier 116 and inputs 194, 195 which are connected across the output of the rectifier 140. These inputs are respectively connected across a voltage divider for each rectifier, as shown in the circuit of FIG. 2, to establish fractional voltage portions for the respective rectifier which are selectively applied to a respective error amplifier for regulating the output of the respective rectifier to a either a normal output voltage for the rectifier or to a battery test voltage. Each of the error amplifiers have a respective reference voltage and voltage divider, as in FIG. 2, with the voltage divider for each rectifier which utilizing three resistors and a respective transistor for shorting out the middle resistor of the voltage divider with each transistor having a test control switch in its base circuit which is operated from a normally open position breaking the base circuit of the respective transistor to a closed position to short the respective resistor out of the voltage divider to initiate a battery test period. Essentially the voltage control circuit merely duplicates the circuitry of FIG., 2 for each of the rectifiers with different voltages involved. While the foregoing components or elements of the voltage control circuit have not been shown in FIG. 5. FIG. 5 includes a battery test control circuit 30' connected with the voltage control circuit for the rectifiers 116 and 140 which comprises battery test switches 31' and 31", which correspond to the switch 31 of the test control circuit of FIG. 2, in the voltage control circuitry for the rectifiers 116 and 140 respectively for changing the fractional portion of the output voltage of the rectifiers used to regulate the respective rectifier output and change the effective voltage thereof for purposes of testing the battery power source.

According to the circuit of FIG. 5, a battery test would be initiated by actuation of both test switches 31' and 31". This would reduce the outputs of both rectifiers 116 and 140, allowing the battery to assume the load. Note that if only test switch 31' is actuated, only the output of rectifier 116 will be reduced, and rectifier 140 will assume the load, hence the ability of rectifier 140 to provide power can be safely tested. The output of rectifier 116 will have been reduced to a level below that of the battery, so a failure of rectifier 140 will result in the assumption of the load by the battery. If the battery were to subsequently fail, the UPS would still be provided with power from rectifier 116.

In view of the foregoing description of the embodiments of FIGS. 1–5, it will be clear to those of ordinary skill in the art that instead of lowering the effective voltages of the a.c. power supplies in FIG. 5, the voltage of the battery power source can be boosted as in the manner described in the embodiments of FIGS. 3 & 4 to establish the battery power source as the priority power source for purposes of testing the battery. By boosting the effective voltage of the battery power source of FIG. 5 in accordance with the teachings herein relative to the embodiment of FIGS. 3 and 4 so as to make the effective voltage of the battery higher than the normal effective voltage of the first a.c. power source, the a.c. power sources will remain operational and their effective voltages need not be changed.

It will be understood that the embodiment of FIG. 5 may be operated with only two power sources, either by not using one of the rectifier power sources or by entirely eliminating one with the UPS then having two power sources, one rectifier power source and one battery power source.

Figure 7:
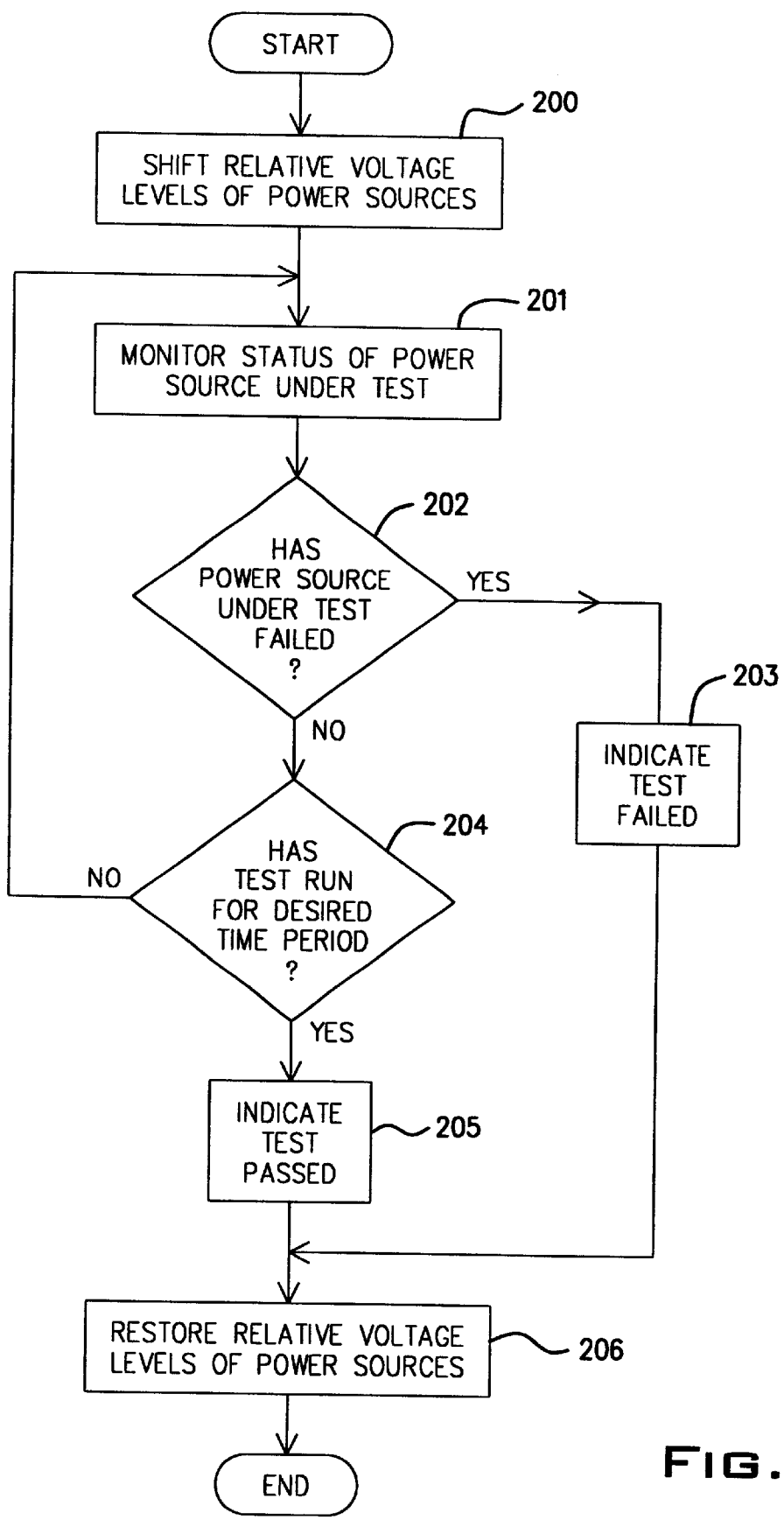
FIG. 7 is a flow chart for the method of battery testing according to the present invention.

It is contemplated that the respective change over switches described and shown in the drawings for changing between normal operation and the battery test mode may be located away from the other voltage control circuitry at the UPS or remote from the UPS or remotely controlled from an external location, for example, using a conventional relay or other electronic switching located at a desired location apart from the actual circuitry for the UPS Moreover the system may be computer controlled at the location of the UPS or by remote computers through the use of modems and/or other gear at or remote from the UPS location, such as a central control for a given area. FIG. 7 is a flow chart illustrating a test as contemplated by the present invention. When the sequence is initiated, it causes a shift of the relative voltage levels (200), of the power sources, for example the power sources 114, 140, such that the power source to be tested is given priority and thus assumes the load. This may be accomplished by either increasing the relative voltage of the power source to be tested as described in FIGS. 3 and 4, or by decreasing the relative voltage(s) of higher priority power source(s) as has been previously described herein with reference to FIGS. 1, 2, and 5. This initiation of the test may be accomplished manually by adjustment of voltage controls, manually by operation of a test switch which causes a suitable shift of relative voltage levels as described herein, or automatically in response to a computer generated command which may be generated periodically, for example, or in response to some program or condition such as temperature or previous operational history. The status of the power source under test is monitored at 201. This monitoring process may be accomplished manually, such as by observation of a volt meter connected to the battery test circuit 30 of FIGS. 1 and 2 at terminals 30a, 30b, or the change in voltage levels may be sensed automatically by suitable voltage detection circuitry well known to those in the art. At 202, the status of the power source under test is evaluated to determine whether or not it has failed. This determination may be accomplished automatically by comparing the status of the power source with a known standard, such as by comparing the source's output voltage with a reference voltage, or the determination may be made manually by the judgment of the test operator. Most typically an electronic comparator circuit would compare the voltage of the power source to a reference, and determine that the power source has failed when its voltage falls below that of the reference. This may be accomplished using a dedicated comparator by using a compute, both of which are well known.

Upon a determination at 202 that the power source has failed, an indication is given at 203 that the test has been failed. This may be a manual indication, recorded by the test operator, but more commonly would be an alarm, signal, light, or report activated by electronic circuitry. The test having been completed, the relative voltage levels of the power sources would be restored to normal at 206, and the test sequence is ended.

Returning to 202, and assuming that the power source under test has not failed, a determination is made at 204 as to whether or not the test has run for a desired time period. This determination may be made by an electronic timing circuit which compares the elapsed time since the start of the test to a desired test interval, or it may be made manually by the test operator with reference to a clock or some other time reference. If the test has not yet run for the desired duration, the status of the power source under test is again monitored at 201, and evaluated at 202. The control loop comprised of steps 201, 202, & 204 repeats until the power source under test fails, or the test has run for the desired time period.

Assuming that the power source under test has not failed, and that the desired test time has elapsed, an indication is given at 205 that the test has been passed. As was described previously with respect to step 203, this indication may take the form of an electronic signal, light, or report generated by a computer associated with the test sequence; or it may be simply the observation of the human test operator. The test having been completed, the relative voltage levels of the power sources are restored to normal at step 206, and the test sequence ends.

While the use of a voltmeter has been described in connection with the terminals 30a, 30b shown in FIGS. 1 and 2 to monitor the operation of the battery during the test period, it will be understood that the terminals may be used for alarm circuitry or to otherwise provide an alert signal, and that the battery test circuitry may have other input or output terminals to operate the switch 31 remotely from computers or other gear while the computer or other gear monitors the performance of the battery from the connections to the terminals 30a, 30b. In the foregoing description of the invention, the power sources have been described has having voltages of different magnitudes which determine the order in which the power sources supply the load power for the UPS system. It will be understood that when claims use the term "effective" with respect to the voltages of different magnitudes for determining priority of the power sources that, as in FIG. 5. the voltage is not necessarily the output voltage of a power source but may be a voltage derived from the power source and which is applied to the common circuitry that supplies the load from the power source having the voltage higher than any other. Moreover, while a voltage divider with a transistor switch has been disclosed in the preferred embodiments for changing the effective voltage of a power source, a switching between two effective voltages for a power source might be accomplished, for example, by manually operating a potentiometer between two fixed preset positions, e.g., between two fixed stops.

What I claim is:

1. In a method of operating an uninterruptible power supply system for supplying power to a load from one of a plurality of available operating power sources including a battery power source with the power sources having normal effective operating voltages of different magnitudes and power from the system being supplied by the power source having an effective operating voltage higher than any other descending first effective voltage with the effective voltages having a first relationship defining an order for the respective power sources to supply load power, the battery power source being lower in the order than at least one other power source, a method of testing the condition of the lower order battery power source comprising the steps of:

switching the normally effective voltage of at least one operating power source from a first level to a second level while the battery power source and at least one other power source are operational to make the effective operating voltage of the battery power source higher than that of any other power source to make the battery power source the primary power source for supplying load power for a test period, and switching each effective voltage changed to said second level back to its first level to terminate the battery test, wherein the operational effective voltage of said battery power source is increased to a level above the normal operational effective voltages of the other operating power sources.

2. In a method as defined in claim 1 in which each d.c. power source established by rectifying power from a respective a.c. power supply includes the step of regulating the rectified d.c. voltage of the power source to establish the effective voltage level for the d.c. power source, and, on initiating a test of the battery power source, switching the voltage level to which the rectified d.c. power is regulated to provide an effective voltage level below the operational effective voltages for the battery power source during the test period to provide back up power for the battery.

3. In a method as defined in claim 1 which includes the step of monitoring the performance of the battery power source during the battery test period.

4. In a method as defined in claim 3 in which the battery test period is automatically terminated upon failure of the battery to supply load power.

5. In a method as defined in claim 3 in which the battery test is conducted for a predetermined period.

6. In a method of operating an uninterruptible power supply system for supplying power to a load from one of a plurality of available operating power sources including a battery power source with the power sources having normal effective operating voltages of different magnitudes and power from the system being supplied by the power source having an effective operating voltage higher than any other descending first effective voltage with the effective voltages having a first relationship defining an order for the respective power sources to supply load power, the battery power source being lower in the order than at least one other power source, a method of testing the condition of the lower order battery power source comprising the steps of:

switching the normally effective voltage of at least one operating power source from a first level to a second level while the battery power source and at least one other power source are operational to make the effective operating voltage of the battery power source higher than that of any other power source to make the battery power source the primary power source for supplying load power for a test period, wherein the effective voltage of the battery power source to be tested is boosted to a higher level than its normal operating effective voltage; and switching each effective voltage changed to said second level back to its first level to terminate the battery test.

7. In a method as defined in claim 6 in which the boosting of the effective voltage for the battery is to a voltage level higher than the normal operational effective voltage for each other power source.

8. An uninterruptible power supply system having an output terminal for continuously supplying uninterrupted power to a load from one of a plurality of power sources comprising: a battery power source and at least one other power source, said power sources having effective voltages of different magnitudes with the magnitudes of the effective voltages establishing a first relationship between the effective voltages which determines an order in which each is to supply load with the power source having the higher effective voltage than any other having priority and supplying the load power, said battery power source being low in said order, said system comprising voltage control circuitry for changing the output priority of at least one of said power sources to effect a test of the battery power source, said voltage control circuitry having a first setting establishing said first relationship between said effective voltages in which the magnitude of the effective voltage for the battery is lower than at least another of said power sources, and a second setting establishing a second relationship between said effective voltages in which the effective voltage magnitude of said battery power source is higher than any other effective voltage, said voltage control circuitry comprising switching for changing the voltage control circuitry between said first and second settings, said voltage control circuit controlling the effective voltage of the battery power source and said second setting of said voltage control raising the effective voltage of the battery power source to a voltage above the effective voltage of any other source.

9. An uninterruptible power supply system as defined in claim 8 in which each power source other than a battery power source comprises an a.c. to d.c. rectifier and said system comprises inverter circuitry for inverting the d.c. power from the power sources of the system to a.c. power for the load.

10. An uninterruptible power supply as defined in claim 9 having one rectifier power source and said battery power source and in which said inverter circuitry comprises an inverter having a common input for said battery power source and the rectifier power source.

11. An uninterruptible power supply as defined in claim 9 in which said inverter circuitry comprises an inverter having a common input for said battery power source and a first power source with the higher of the effective voltages on the input for the inverter back biasing power from any other power source.

12. An uninterruptible power supply as defined in claim 9 in which said inverter circuitry comprises a separate inverter for each power source and transforming means comprising a primary for each inverter with each primary being connected to output of its respective inverter and said transforming means having a common secondary circuit for said primaries to establish said effective voltages for each of said power sources with load power being supplied from the power source having the effective voltage on the common secondary which is higher than any other power source and which back biases power from each other power source through its respective primary and inverter.

13. An uninterruptible power supply system as defined in claim 12 in which said voltage control circuitry regulates the output of each said rectifier to provide said first relationship between said effective voltages in which the effective voltage of each rectifier is higher than that of the battery power source and responsive to said switching to regulate the output of each rectifier to provide said second relationship in which the effective voltage of each rectifier is lower than the effective voltage of the battery.

14. An uninterruptible power supply system having an output terminal for continuously supplying uninterrupted power to a load from one of a plurality of power sources comprising: a battery power source and at least one other power source, said power sources having effective voltages of different magnitudes with the magnitudes of the effective voltages establishing a first relationship between the effective voltages which determines an order in which each is to supply load with the power source having the higher effective voltage than any other having priority and supplying the load power, said battery power source being low in said order, said system comprising voltage control circuitry for changing the output priority of at least one of said power sources to effect a test of the battery power source, said voltage control circuitry having a first setting establishing said first relationship between said effective voltages in which the magnitude of the effective voltage for the battery is lower than at least another of said power sources, and a second setting establishing a second relationship between said effective voltages in which the effective voltage magnitude of said battery power source is higher than any other effective voltage, said voltage control circuitry comprising switching for changing the voltage control circuitry between said first and second settings, wherein each power source other than a battery power source comprises an a.c. to d.c. rectifier and said system comprises inverter circuitry for inverting the d.c. power from the power sources of the system to a.c. power for the load, and, wherein said voltage control circuitry controls the effective voltage from the battery power source and the said first setting of the voltage control circuit establishes an effective voltage for the battery power source lower than that of each rectifier power source and said second setting changing the effective voltage of the battery power source to an effective voltage higher than that of any other power source.

15. An uninterruptible power supply system system having an output terminal for continuously supplying uninterrupted power to a load from one of a plurality of power sources comprising: a battery power source and at least one other power source, said power sources having effective voltages of different magnitudes with the magnitudes of the effective voltages establishing a first relationship between the effective voltages which determines an order in which each is to supply load with the power source having the higher effective voltage than any other having priority and supplying the load power, said battery power source being low in said order, said system comprising voltage control circuitry for changing the output priority of at least one of said power sources to effect a test of the battery power source, said voltage control circuitry having a first setting establishing said first relationship between said effective voltages in which the magnitude of the effective voltage for the battery is lower than at least another of said power sources, and a second setting establishing a second relationship between said effective voltages in which the effective voltage magnitude of said battery power source is higher than any other effective voltage, said voltage control circuitry comprising switching for changing the voltage control circuitry between said first and second settings, wherein each power source other than a battery power source comprises an a.c. to d.c. rectifier and said system comprises inverter circuitry for inverting the d.c. power from the power sources of the system to a.c. power for the load;

said inverter circuitry comprises a separate inverter for each power source and transforming means comprising a primary for each inverter with each primary being connected to output of its respective inverter and said transforming means having a common secondary circuit for said primaries to establish said effective voltages for each of said power sources with load power being supplied from the power source having the effective voltage on the common secondary which is higher than any other power source and which back biases power from each other power source through its respective primary and inverter; and wherein said voltage control circuitry is connected to control the output of said battery and responsive to said switching being switched to its second setting to convert output of the battery to an effective voltage higher than each rectifier source to establish said second relationship.

* * * * *